United States Patent
Kurachi et al.

(10) Patent No.: US 8,829,391 B2
(45) Date of Patent: Sep. 9, 2014

(54) LASER PROCESSING METHOD

(75) Inventors: Kosuke Kurachi, Kawasaki (JP);
Masahiko Kubota, Tokyo (JP); Akihiko Okano, Kawasaki (JP); Atsushi Hiramoto, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 287 days.

(21) Appl. No.: 12/907,349

(22) Filed: Oct. 19, 2010

(65) Prior Publication Data

US 2011/0108532 A1 May 12, 2011

(30) Foreign Application Priority Data

Nov. 9, 2009 (JP) .................... 2009-255897

(51) Int. Cl.
*B23K 26/42* (2006.01)
*B23K 26/40* (2014.01)
*B23K 26/18* (2006.01)
*B23K 26/36* (2014.01)
*H01L 21/268* (2006.01)
*B23K 26/00* (2014.01)

(52) U.S. Cl.
CPC .......... *B23K 26/421* (2013.01); *B23K 26/4075* (2013.01); *B23K 26/18* (2013.01); *B23K 26/365* (2013.01); *H01L 21/268* (2013.01); *B23K 26/0057* (2013.01)
USPC ............... 219/121.72; 219/121.6; 219/121.69

(58) Field of Classification Search
USPC ............... 219/121.6, 121.67, 121.68, 121.72, 219/121.69
See application file for complete search history.

(56) References Cited

U.S. PATENT DOCUMENTS

| | | | | |
|---|---|---|---|---|
| 5,968,382 A | * | 10/1999 | Matsumoto et al. | 219/121.72 |
| 6,002,101 A | * | 12/1999 | Yamazaki et al. | 219/121.75 |
| 7,459,242 B2 | * | 12/2008 | Zait et al. | 430/5 |
| 8,093,530 B2 | | 1/2012 | Nishiwaki et al. | |

(Continued)

FOREIGN PATENT DOCUMENTS

| | | |
|---|---|---|
| CN | 1758985 A | 4/2006 |
| CN | 101073145 A | 11/2007 |
| JP | 2-92482 A | 4/1990 |
| JP | 04167985 A * | 6/1992 |

OTHER PUBLICATIONS

Chinese Official Action dated Mar. 19, 2013, issued in counterpart Chinese Patent Application No. 201010531431.2, with an English translation.

(Continued)

*Primary Examiner* — Henry Yuen
*Assistant Examiner* — Ayub Maye
(74) *Attorney, Agent, or Firm* — Fitzpatrick, Cella, Harper & Scinto

(57) ABSTRACT

A laser processing method of processing an object to be processed. The object to be processed has a modified portion and a non-modified portion. A modified layer forming step forms a modified layer of the object to be processed by scanning an inner portion of the object with a condensing point of first laser light. The modified layer (i) has a processing speed with second laser light that is lower than a processing speed of a non-modified portion and (ii) is formed below the non-modified portion. A removing step removes a portion of the non-modified portion. The portion of the non-modified portion ranges from a surface of the object to the modified layer. The removing step includes irradiating the portion of the non-modified portion with the second laser light.

9 Claims, 7 Drawing Sheets

(56) References Cited

U.S. PATENT DOCUMENTS

| | | |
|---|---|---|
| 8,283,595 B2 * | 10/2012 | Fukuyo et al. ........... 219/121.69 |
| 8,685,838 B2 | 4/2014 | Fukuyo et al. |
| 2001/0019044 A1 * | 9/2001 | Bertez et al. ............. 219/121.72 |
| 2005/0084767 A1 | 4/2005 | Zait et al. |
| 2006/0108338 A1 * | 5/2006 | Nishiwaki et al. ....... 219/121.72 |
| 2009/0098713 A1 * | 4/2009 | Sakamoto .................... 438/463 |
| 2009/0224432 A1 | 9/2009 | Nagatomo et al. |

OTHER PUBLICATIONS

Chinese Official Action dated Mar. 13, 2013, issued in counterpart Chinese Patent Application No. 201010531431.2, with an English translation.

Chinese Office Action dated Apr. 23, 2014, issued in counterpart Chinese Patent Application No. 201010531431.2, with an English translation.

* cited by examiner

LASER PROCESSING METHOD

CLAIM OF PRIORITY

This application claims the benefit of Japanese Patent Application No. 2009-255897, filed Nov. 9, 2009, which is hereby incorporated by reference herein in its entirety.

BACKGROUND OF THE INVENTION

Field of the Invention

The present invention relates to a laser processing method of removing a portion of an object to be processed using layer light.

Up to now, when holes or grooves are to be formed in a substrate, for example, a semiconductor material substrate, a glass substrate, or a piezoelectric material substrate, which is an object to be processed, the substrate is irradiated with laser light by a generally known laser processing method for removal and processing. In such a kind of laser processing method, a laser light irradiation time necessary for laser processing of the substrate is normally determined based on a result obtained by trial processing. Even when a correct laser light irradiation time is determined based on the result obtained by trial processing, however, a removal depth may fluctuate due to fluctuations in thickness of the substrate and the surface area.

As measures to solve such a problem, there may be conceived such a laser processing method as described in Japanese Patent Application Laid-Open No. H02-092482. In this laser processing method, a substrate is made of different materials, for example, an insulating material and a metal material. When a change in reflectance of laser light on the metal material is detected while the insulating material is laser-processed, processing with the laser light is stopped. Therefore, holes may be formed only in the insulating material.

In the conventional laser processing method described above, however, the object to be processed is an object that includes a processed portion and a non-processed portion that are made of different materials (for example, a printed circuit board, in which steel material is buried). When the object to be processed is made of for example, a single material (for example, a Si wafer), the laser processing method described above cannot be applied. In the conventional laser processing method described above, a processing shape is determined depending on a shape of the non-processed portion, and, hence, the degree of freedom of processing is low.

SUMMARY OF THE INVENTION

An object of the present invention, therefore, is to provide a laser processing method that is capable of improving the precision of a processing shape, and has a higher degree of freedom of the processing shape.

The laser processing method according to the present invention includes a modified layer forming step of forming a modified layer that becomes a boundary of a laser processing region by scanning an inner portion of an object to be processed, with a condensing point of first laser light, and a removing/processing step of removing and processing the laser processing region defined by the modified layer by irradiating a surface of the object to be processed, with second laser light that is condensed.

According to the present invention, a laser processing speed of the modified layer formed in the object to be processed in a modified layer forming step is lower than a laser processing speed of a non-modified region. Therefore, when the removal processing is performed in a removing/processing step, a processing shape may be determined by the modified layer. Thus, the precision of processing in a case when the object to be processed is removed using the second laser light is improved. The modified layer may be formed into an arbitrary shape using the first laser light, and, hence, the degree of freedom of the processing shape is improved.

Further features of the present invention will become apparent from the following description of exemplary embodiments, with reference to the attached drawings.

BRIEF DESCRIPTION OF THE DRAWINGS

FIGS. 2A, 2B, and 2C illustrate a modified layer forming step controlled by a control device of the laser processing apparatus according to the first embodiment of the present invention, in which FIG. 2A illustrates a state in which a substrate is scanned with modification laser light, FIG. 2B illustrates a state in which a modified layer is formed in the substrate, and FIG. 2C is a plan view illustrating the substrate.

FIGS. 3A, 3B, and 3C illustrate a removing/processing step controlled by the control device of the laser processing apparatus according to the first embodiment of the present invention, in which FIG. 3A illustrates a state in which a substrate is scanned with processing laser light, FIG. 3B illustrates a state in which the substrate is scanned with the processing laser light to continue processing, and FIG. 3C illustrates a state in which the substrate is scanned with the processing laser light to complete the processing.

FIGS. 4A and 4B illustrate a recess portion formed by a laser processing method, in which FIG. 4A is a cross-sectional view illustrating the recess portion in the substrate and FIG. 4B is a plan view illustrating the substrate.

FIGS. 5A, 5B, and 5C illustrate a modified layer forming step controlled by a control device of a laser processing apparatus according to a second embodiment of the present invention, in which FIG. 5A illustrates a state in which a substrate is scanned with modification laser light, FIG. 5B illustrates a state in which a modified layer is formed in the substrate, and FIG. 5C is a plan view illustrating the substrate.

FIGS. 6A and 6B illustrate a removing/processing step controlled by the control device of the laser processing apparatus according to the second embodiment of the present invention, in which FIG. 6A illustrates a state in which a substrate is scanned with processing laser light and FIG. 6B illustrates a state in which the substrate is scanned with the processing laser light to continue the processing.

FIGS. 7A and 7B illustrate a through portion formed by a laser processing method, in which FIG. 7A is a cross-sectional view illustrating the through portion in the substrate and FIG. 7B is a plan view illustrating the substrate.

DESCRIPTION OF THE EMBODIMENTS

Embodiments of the present invention will now be described in detail with reference to the attached drawings.

[First Embodiment]

Figure 1:
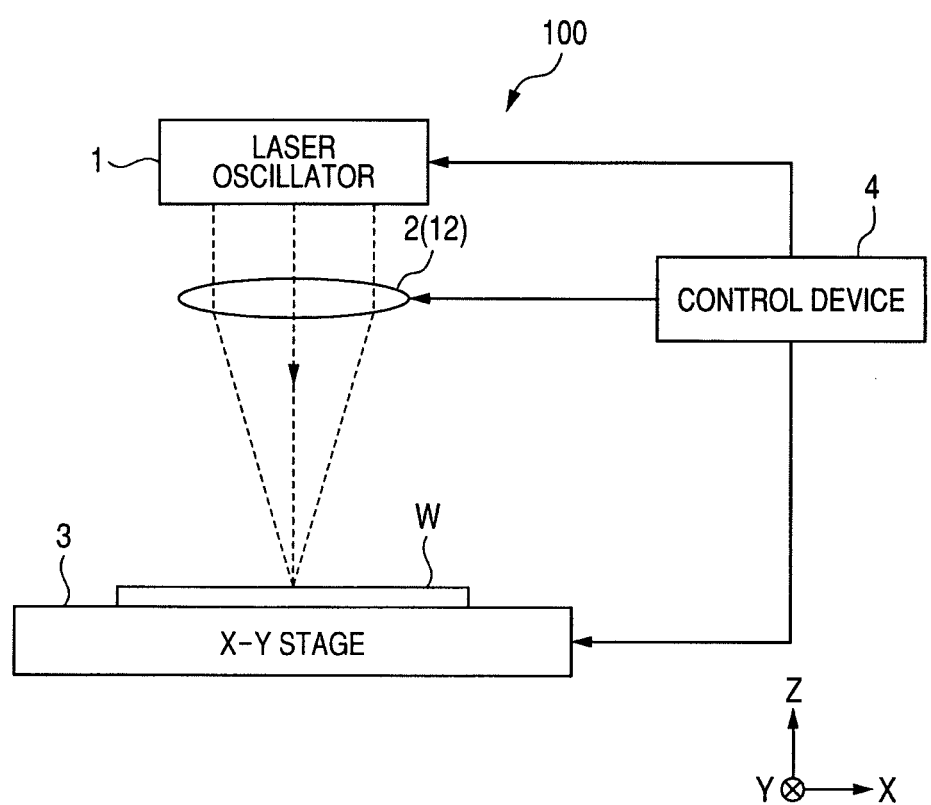
FIG. 1 illustrates a schematic structure of a laser processing apparatus according to a first embodiment of the present invention.

FIG. 1 illustrates a schematic structure of a laser processing apparatus according to a first embodiment of the present invention. A laser processing apparatus 100 illustrated in FIG. 1 has a structure capable of irradiating a substrate W, which is an object to be processed with laser light, to form, in the substrate W, a recess portion, for example, a dot (hole) or a linear or curved groove. The laser processing apparatus 100 includes a laser oscillator 1, a condensing lens 2 (12), an XY-stage 3, and a control device 4. A YAG laser, a $CO_2$ laser, an excimer laser, a solid laser, or a dye laser is used as the laser oscillator 1. The substrate W, which is the object to be processed, is set on the XY-stage 3. The condensing lens 2 (12) is provided between the laser oscillator 1 and the XY-stage 3 (substrate W). The control device 4 controls a laser light emission time and laser light emission timing of the laser oscillator 1, and controls the movement of the XY-stage 3 in an X-axis direction and a Y-axis direction. Further, the control device 4 controls the movement of the condensing lens 2 (12) in a Z-axis direction. Therefore, a condensing point of the laser light that is produced by the condensing lens 2 (12) may be shifted in the X-axis direction, the Y-axis direction, and the Z-axis direction relative to the substrate W. An XYZ-stage, instead of the XY-stage 3, may be used to move the substrate W in the Z-axis direction. Note that, each of the X-axis direction and the Y-axis direction is a direction parallel to a surface of the substrate W and the Z-axis direction is a direction perpendicular to the surface of the substrate W.

The laser light emitted from the laser oscillator 1 is condensed by the condensing lens 2 (12) and the substrate 2 is irradiated with the condensed laser light. In the first embodiment, the substrate W is moved in the X-axis direction and the Y-axis direction to scan the substrate W with the laser light. When the substrate W is to be scanned with the laser light, for example, a mirror may be used to shift the laser light in the X-axis direction and the Y-axis direction relative to the substrate W. The substrate W is made of a single material. Examples of the substrate W include a semiconductor material substrate (for example, a silicon wafer), a piezoelectric material substrate made of $LiTaO_3$, and a glass substrate.

In the first embodiment, laser processing for the substrate W is controlled by the control device 4. The laser processing method broadly includes a modified layer forming step of forming a modified layer in an inner portion of the substrate W and a removing/processing step of performing removal processing on a laser processing region defined by the modified layer.

In the modified layer forming step, modification laser light, which is first laser light, is condensed by the condensing lens 2, and the substrate W is irradiated with the condensed modification laser light to form the modified layer in the inner portion of the substrate W. Laser light transparent to the substrate W is used as the modification laser light. To be specific, the modification laser light is desired to have a characteristic of "(transmittance on substrate W)>(absorption coefficient on incident surface of substrate W)". In the removing/processing step, the substrate W is irradiated with processing laser light, which is second laser light, to form a recess portion in the substrate W. The laser removal processing is performed so that the processing laser light is condensed by the condensing lens 12 for irradiation to melt and to vaporize (or ablate) a portion of the substrate W.

In the first embodiment, the modification laser light and the processing laser light are emitted from the common laser oscillator 1. The condensing lens used for the modified layer forming step is changed to the condensing lens 12 in the removing/processing step. The laser oscillator may be changed to the condensing lens 12 in the removing/processing step. The laser oscillator may be changed to another laser oscillator between the modified layer forming step and the removing/processing step. The modification laser light and the processing laser light may have the same property.

Figure 2A:
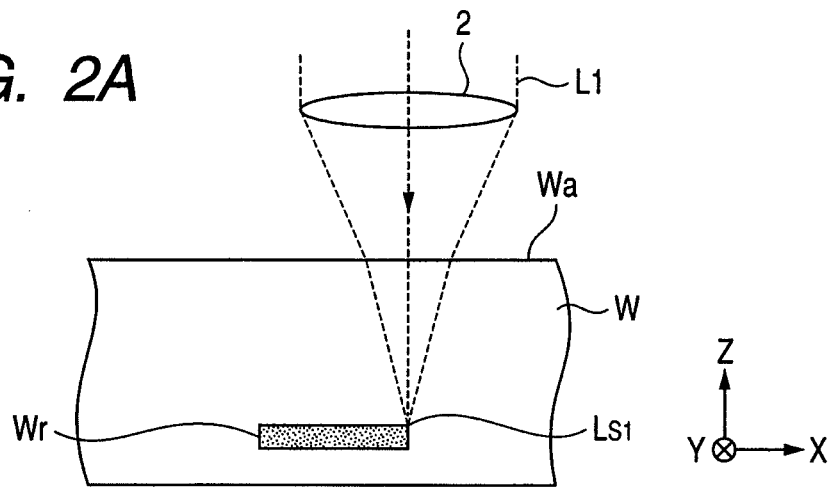
Figure 2B:
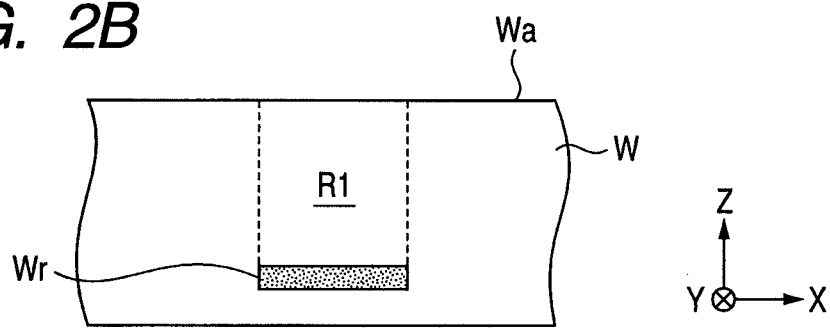
Figure 2C:
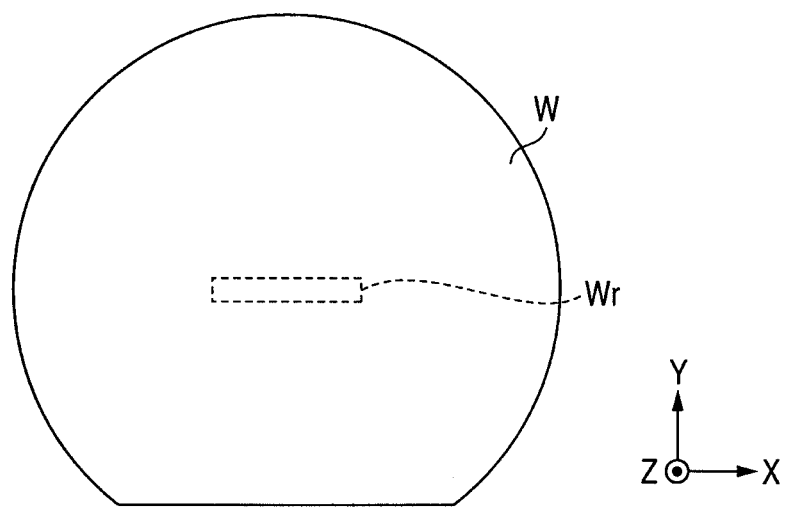

The modified layer forming step is specifically described with reference to FIGS. 2A, 2B, and 2C. As illustrated in FIG. 2A, a condensing point $L_{S1}$ of modification laser light L1 emitted from the laser oscillator 1 is set in the inner portion of the substrate W by the condensing lens 2. The condensing point $L_{S1}$ set in the inner portion of the substrate W and a region close to the condensing point have a higher energy density than a region except for the condensing point $L_{S1}$ and the close region, through which the modification laser light L1 passes. Therefore, in the condensing point $L_{S1}$ set in the inner portion of the substrate W and the close region, a change in absorption coefficient and a phenomenon, including multiphoton absorption, are induced due to local heating, to thereby perform modification. When the scanning with the condensing point $L_{S1}$ of the modification laser light L1 is performed, as illustrated in FIG. 2A, a modified layer Wr, which becomes a boundary of a laser processing region, is formed, as illustrated in FIG. 2B. In the first embodiment, the scanning with the condensing point $L_{S1}$ of the modification laser light L1 is performed in the X-axis direction (or Y-axis direction) to form the modified layer Wr, which becomes a bottom part of a recess portion, for example, a hole or a groove, as illustrated in FIG. 2C. In other words, in the first embodiment, the bottom part of the recess portion corresponds to a boundary or a laser processing region R1. The modified layer Wr is formed in the boundary.

The modified layer Wr is a region that is obtained by irradiating a portion of a material of the substrate W with the modification laser light L1 and that is different in characteristic and structure from a non-irradiated region. To be specific, the modified layer Wr has the following three states (1), (2), and (3). Note that, of the following three modification actions, multiple modification actions may be simultaneously caused.

(1) A Case When a Modified Layer is a Melting Processing Region

A melting processing region is a region in which, for example, a change in crystalline structure is induced in a case when the material of the substrate W1 is melted and then solidified again. The melting processing region may be a phase-changed region or a region in which a crystalline structure is changed. Alternatively, the melting processing region may be a region in which, of a single-crystalline structure, an amorphous structure, and a polycrystalline structure, a structure is changed to another structure. In this case, the condensing point $L_{S1}$ of the modification laser light L1 is focused on the inner portion of the substrate W (a semiconductor material substrate, for example, a silicon wafer). The substrate W is irradiated with the modification laser light L1 in a condition in which an electrical field strength at the condensing point $L_{S1}$ is equal to or greater than $1 \times 10^8$ (W/cm²) and a pulse width is equal to or less than 1 μsec. Therefore, multi-photon absorption occurs in this inner portion of the substrate W and the substrate W is locally heated, and, hence, the melting processing region is formed in the inner portion of the substrate W. When the substrate W has a single-crystal silicon structure, the melting processing region has, for example, an amorphous silicon structure. In this case, an upper limit value of the electrical field strength is, for example, $1 \times 10^8$ (W/cm²). The pulse width is preferred to be, for example, in a range of 1 nsec. to 200 nsec.

(2) A Case When a Modified Layer is a Crack Region

A crack region is a region in which a crack is caused by stress generated in an irradiation area of the condensing point $L_{S1}$ on the substrate W and a region close to the irradiation area by expansion of the irradiation area. In this case, the condensing point of $L_{S1}$ of the modification laser light L1 is focused on the inner portion of the substrate W (for example, glass or a piezoelectric material ($LiTaO_3$)). The substrate W is irradiated with the modification laser light L1 in a condition in which the electrical field strength at the condensing point $L_{S1}$ is equal to or greater than $1 \times 10^8$ (W/cm$^2$) and the pulse width is equal to or less than 1 µsec. Therefore, multi-photon absorption occurs in the inner portion of the substrate W, and, hence, a crack region is formed in the inner portion of the substrate W without necessary damage to the substrate W. An upper limit value of the electrical field strength is, for example, $1 \times 10^8$ (W/cm$^2$). The pulse width is preferred to be, for example, in a range of 1 nsec. to 200 nsec.

(3) A Case When a Modified Layer is a Refractive Index Change Region

A refractive index change region is a region in which a change in density or a refractive index is induced by local exposure with high energy. In this case, the condensing point $L_{S1}$ is of the modification laser light 1 is focused on the inner portion of the substrate W (for example, glass). The substrate W is irradiated with the modification laser light L1 in a condition in which the electrical field strength at the condensing point $L_{S1}$ is equal to or greater than $1 \times 10^8$ (W/cm$^2$) and the pulse width is equal to or less than 1 nsec. When the pulse width is extremely shortened to cause multi-photon absorption in the inner portion of the substrate W, energy generated by the multi-photon absorption is not changed to thermal energy, and, hence, a structure change, for example, crystallization or a change in ion valence occurs in the inner portion of the substrate W. Therefore, the refractive index change region is formed. An upper limit value of the electrical field strength is, for example, $1 \times 10^8$ (W/cm$^2$). The pulse width is preferred to be, for example, equal to or less than 1 nsec., and, more preferred, to be equal to or less than 1 psec.

A specific example in a case when the substrate W is a silicon wafer will now be described. The substrate W is a silicon wafer and has a thickness of 625 µm and an outer size of six inches. The condensing lens 2 has a magnification of fifty and an NA of 0.55. A transmittance of the modification laser light L1 is 60%. The modified layer Wr is one of the melting processing region, the crack region, and the refractive index region described above. The laser oscillator 1 is a YAG laser. With respect to the modification laser light L1 emitted in the modified layer forming step, a wavelength is 1,064 nm, an oscillation mode is a Q-switch pulse, a pulse width is 30 nm, an output power is 20 µJ/pulse, a laser spot cross-sectional area is $3.1 \times 10^8$ (W/cm$^2$), and a repetition frequency is 80 kHz. When the modification laser light L1 is condensed to the inner portion of the substrate W by the condensing lens 2, an energy density of the modification laser light L1 on a surface Wa of the substrate W is less than $1 \times 10^8$ (W/cm$^2$) and an energy density of the modification laser light L1 at the condensing point $L_{S1}$ is equal to or greater than $1 \times 10^8$ (W/cm$^2$). Scanning with the condensing point $L_{S1}$, illustrated in FIG. 2A, is performed at a speed of 100 nm/sec. Therefore, as illustrated in FIGS. 2B and 2C, the modified layer Wr is formed in a region scanned with the condensing point $L_{S1}$.

The condensing lens 2 and the substrate W are moved relative to each other to successively form the modified layer Wr. A thickness of the modified layer Wr may be adjusted by scanning with the condensing point $L_{S1}$ at changed depth positions to stack multiple modified layer regions. When a relative movement locus between the condensing lens 2 and the substrate W is designed, it is necessary to prevent a region that has already been modified from being located between a region to be modified and the condensing lens 2. This reason is to prevent the modification laser light L1 from entering the region that has already been modified and is being scattered. Therefore, modification is started from a region far away from the surface Wa.

With respect to the modified layer Wr, formed as described above, a laser processing speed in the removing/processing step is lower than a laser processing speed of a non-modified region. Therefore, the modified layer Wr is formed in a region to stop removal processing performed in the removing/processing step later, that is at least a boundary of the laser processing region R1 to be removed. In other words, in the first embodiment, before the removal processing with laser light, the bottom part of the recess portion that is removed is defined by the modified layer Wr. The modified layer Wr may have not a linear shape in each side as illustrated in FIG. 2C, but rather, a curved shape. The modified layer Wr may be located in any position of the substrate W and may reach the surface Wa of the substrate W. The modified layer Wr may be formed in a region except for the region to stop the removal processing. That is, the modified layer Wr may be formed in a region larger in area than the region to stop the removal processing.

Figure 3A:
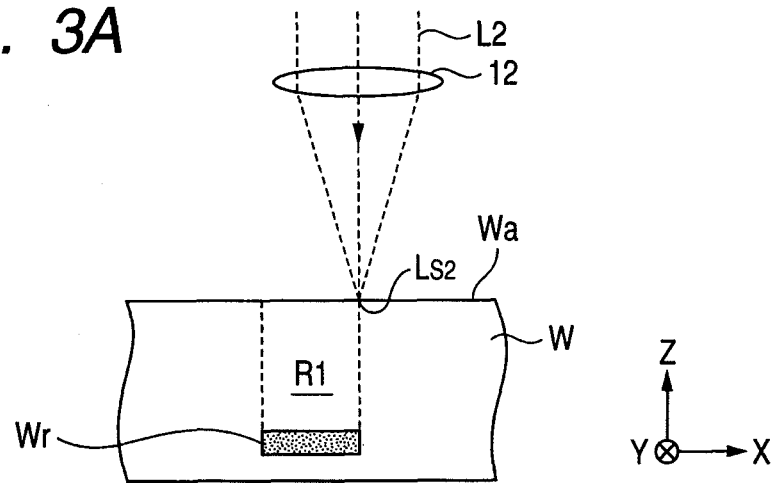

Next, the removing/processing step in the first embodiment is described in detail with reference to FIGS. 3A, 3B, and 3C. The control device 4 performs control so as to irradiate the surface Wa of the substrate W with condensed processing laser light L2 to remove the laser processing region R1 defined by the modified layer Wr.

Note that, the condensing lens 12 and the processing laser light L2 are not particularly limited, as long as a characteristic to remove a portion of the substrate W is obtained. For example, any one of a solid laser, an excimer laser, and a dye laser may be used as a laser source for the processing laser light L2. In the first embodiment, as described above, the processing laser light L2 is emitted from the common laser oscillator 1. The condensing lens 12 is preferred to be prevented from being broken by the processing laser light L2. A transmittance of the condensing lens 12 with respect to the processing laser light L2 is preferred to be equal to or greater than 20%. In this condition, the processing laser light L2 is preferred to be condensed to a condensing point $L_{S2}$. The condensing lens 12 has a magnification of fifty and an NA of 0.55. A transmittance of the processing laser light L2 is 60%. In the removing/processing step, with respect to the processing laser light L2 emitted from the laser oscillator 1, a wavelength is 532 nm, an oscillation mode is a Q-switch pulse, a pulse width is 30 nm, an outer power is 20 µJ/pulse, a laser spot cross-sectional area is $3.1 \times 10^8$ (W/cm$^2$), and a repetition frequency is 80 kHz. In this case, an electrical field strength at the condensing point $L_{S2}$ is preferred to be equal to or greater than $1 \times 10^8$ (W/cm$^2$) and a pulse width is preferred to be equal to or less than 1 µsec.

The condensing point $L_{S2}$ is a point in which an energy density of the processing laser light L2 is a maximum in a case when the processing laser light L2 is condensed by the condensing lens L2. As illustrated in FIG. 3A, the surface Wa of the substrate W is scanned with the condensing point $L_{S2}$ to perform the removal processing in scanning positions of the condensing point $L_{S2}$. A scanning speed of the condensing point $L_{S2}$ is 100 mm/sec.

Figure 3B:
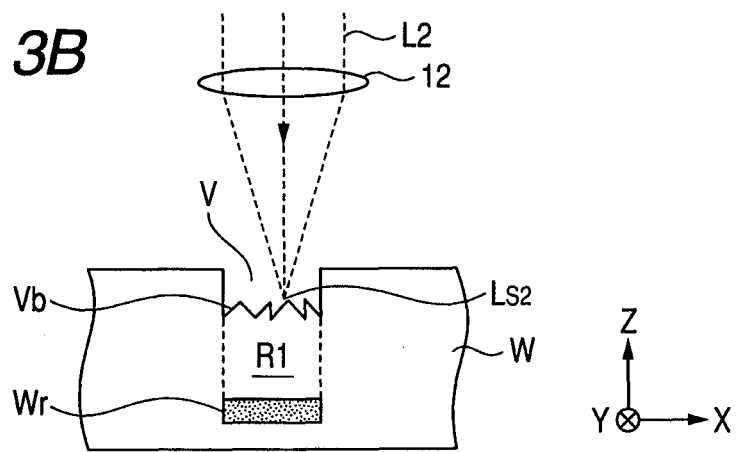
Figure 3C:
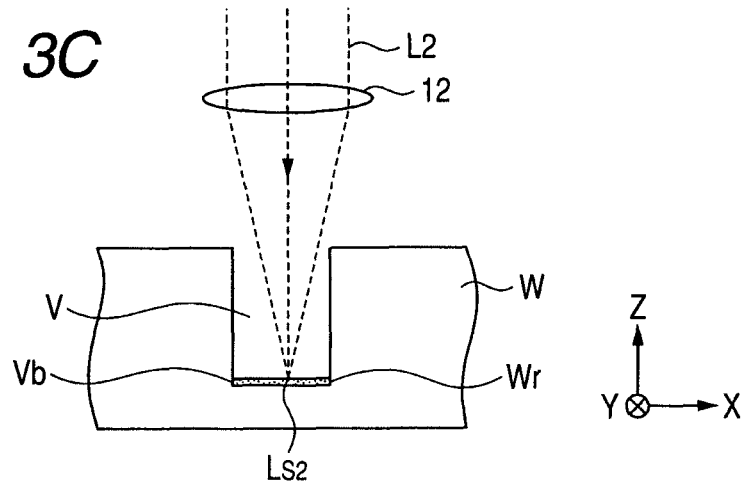

FIG. 3B illustrates a state during the removal processing. A bottom part Vb of a region V removed by the processing laser light L2 is illustrated in FIG. 3B. In the region V that is removed by the processing laser light L2, the amount of removal fluctuates depending on processing dust discharged by the removal processing or a fluctuation in intensity of the processing laser light L2, and, hence, a shape of the bottom part Vb fluctuates. Even when a portion of the bottom part Vb of the removed region V reaches the modified layer Wr early because of the processing fluctuation, the laser processing speed of the modified layer Wr is lower than the laser processing speed of the non-modified region, and, hence, the modified layer Wr is not easily removed by the processing laser light L2. Therefore, as illustrated in FIG. 3C, the fluctuation in shape of the bottom part Vb of the removed region V finally obtained by removal processing, that is, a fluctuation in removal depth is reduced. In other words, the processing shape may be defined by the modified layer Wr.

Figure 4A:
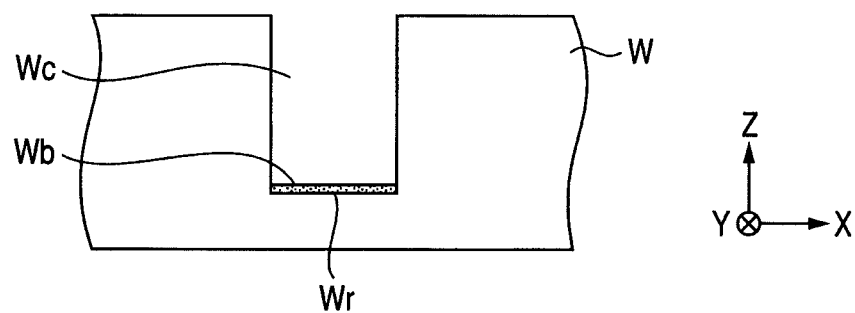
Figure 4B:
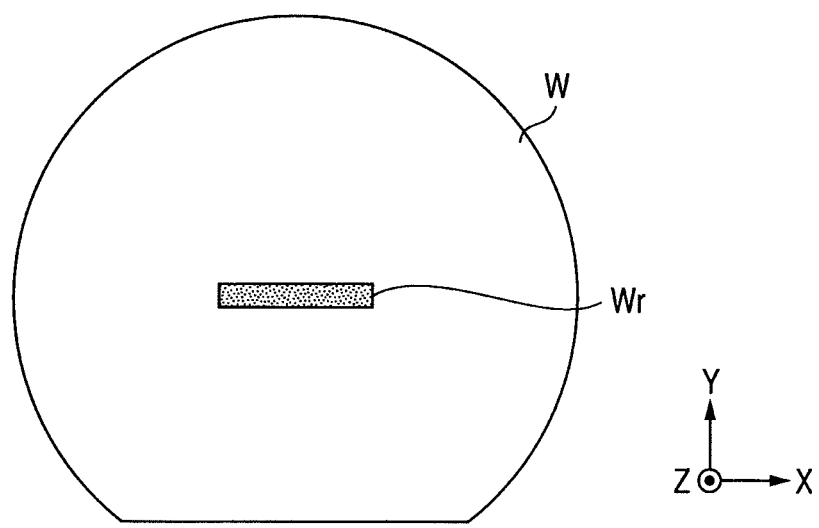

FIGS. 4A and 4B illustrate a recess portion Wc formed by the laser processing method described above. As illustrated in FIGS. 4A and 4B, a bottom part Wb of the recess portion Wc corresponds to the modified layer Wr. When the modified layer Wr is formed, the precision of processing in the case when the substrate W is subjected to the removal processing with the processing laser light L2 is improved.

According to the first embodiment, the laser processing speed of the modified layer Wr during the removing/processing step is lower than that in the non-modified region, and, hence, the non-modified region is easily processed. Therefore, even when a spatial intensity distribution or pulse energy of the processing laser light L2 temporarily varies, a fluctuation in processing amount is reduced by the modified layer Wr, and, hence, the flatness of the bottom part Wb of the recess portion Wc may be improved. Thus, the precision of the processing of the substrate W is improved. The modified layer Wr may be formed into an arbitrary shape by the modification laser light L1 during the modified layer forming step, and, hence, the degree of freedom of the processing shape is improved.

[Second Embodiment]

In the first embodiment, a case in which the recess portion is formed in the substrate is described. In a second embodiment, a case in which a through portion is formed in the substrate is described. The same laser processing apparatus as in the first embodiment is used, and, hence, the description is made with reference to the laser processing apparatus illustrated in FIG. 1.

Even in the second embodiment, the control device 4 executes a modified layer forming step and a removing/processing step. The modified layer forming step is specifically described with reference to FIGS. 5A, 5B, and 5C. In the modified layer forming step, the inner portion of the substrate W, which is the object to be processed, is scanned with the condensing point $L_{S1}$ of the modification laser light L1, which is the first laser light, to form a modified layer Wra that becomes a boundary of a laser processing region R2. A condition of the modification laser light L1 is the same as that in the first embodiment.

Figure 5A:
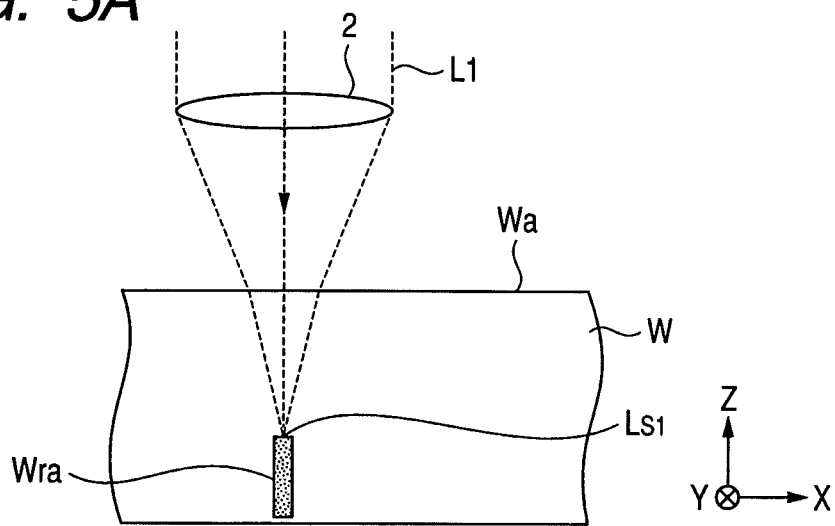
Figure 5B:
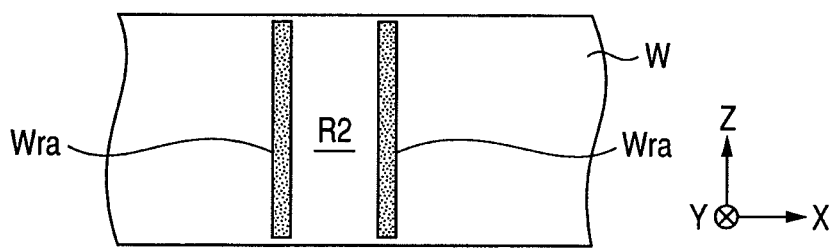
Figure 5C:
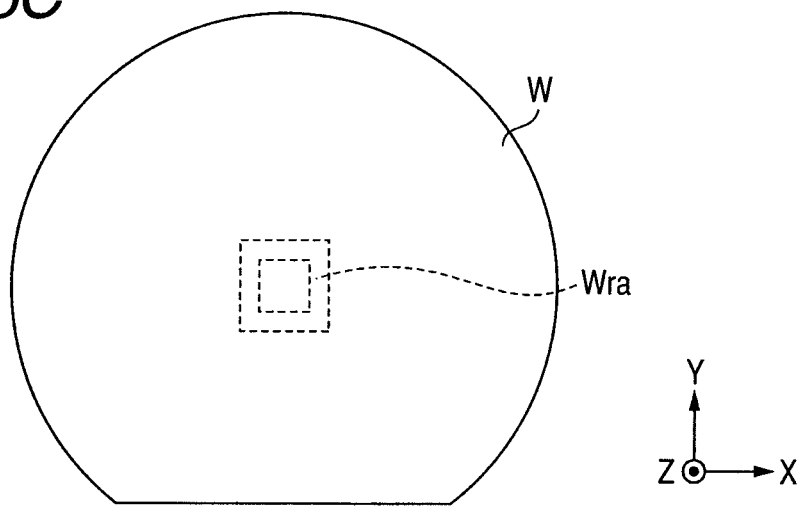

A detailed description is now made. As illustrated in FIG. 5A, the condensing point $L_{S1}$ of modification laser light L1 emitted from the laser oscillator 1 is set in the inner portion of the substrate W by the condensing lens 2. The condensing point $L_{S1}$ set in the inner portion of the substrate W and a region close to the condensing point have a higher energy density than a region except for the condensing point $L_{S1}$ and the close region, through which the modification laser light L1 passes. Therefore, in the condensing point $L_{S1}$ set in the inner portion of the substrate W and the close region, a change in absorption coefficient and a phenomenon, including multi-photon absorption, are induced due to local heating, to thereby perform modification. When the scanning with the condensing point $L_{S1}$ of the modification laser light L1 is performed, as illustrated in FIG. 5A, the modified layer Wra that becomes the boundary of the laser processing region R2 is formed, as illustrated in FIG. 5B. In the second embodiment, the condensing point $L_{S1}$ of modification laser light L1 is shifted for scanning in the X-axis direction, the Y-axis direction, and the Z-axis direction, to form the modified layer Wra that becomes a side wall of the through portion, as illustrated in FIG. 5C. In other words, in the second embodiment, a portion that becomes the side wall of the through portion corresponds to the boundary of the laser processing region R2, and, hence, the modified layer Wra is formed in the boundary. The formed modified layer Wra is one of the melting processing region, the crack region, and the refractive index region. The modified layer Wra is formed by scanning with the condensing point $L_{S1}$ at changed depth positions in the Z-axis direction to stack multiple modified layer regions. When a relative movement locus between the condensing lens 2 and the substrate W is designed, it is necessary to prevent a region that has already been modified from being located between a region to be modified and the condensing lens 2. This reason is to prevent the modification laser light L1 from entering that region that has already been modified and is being scattered. Therefore, modification is successively started from a region far away from the surface Wa.

A laser processing speed of the modified layer Wra formed as described during the removing/processing step is lower than that in a non-modified region. Therefore, in the second embodiment, the modified layer Wra is formed to surround the laser processing region R2. In other words, in the second embodiment, before the removal processing with laser light, the side wall of the through portion, which is removed, is defined by the modified layer Wra. The modified layer Wra may not have a linear shape in each side, as illustrated in FIG. 5B, but rather, a curved shape. The modified layer Wra may be located in any position of the substrate W and may reach the surface Wa of the substrate W. The modified layer Wra may be formed in a region except for the region to define the removal processing. That is, the modified layer Wra may be formed in a region larger in area than the region to define the removal processing.

Figure 6A:
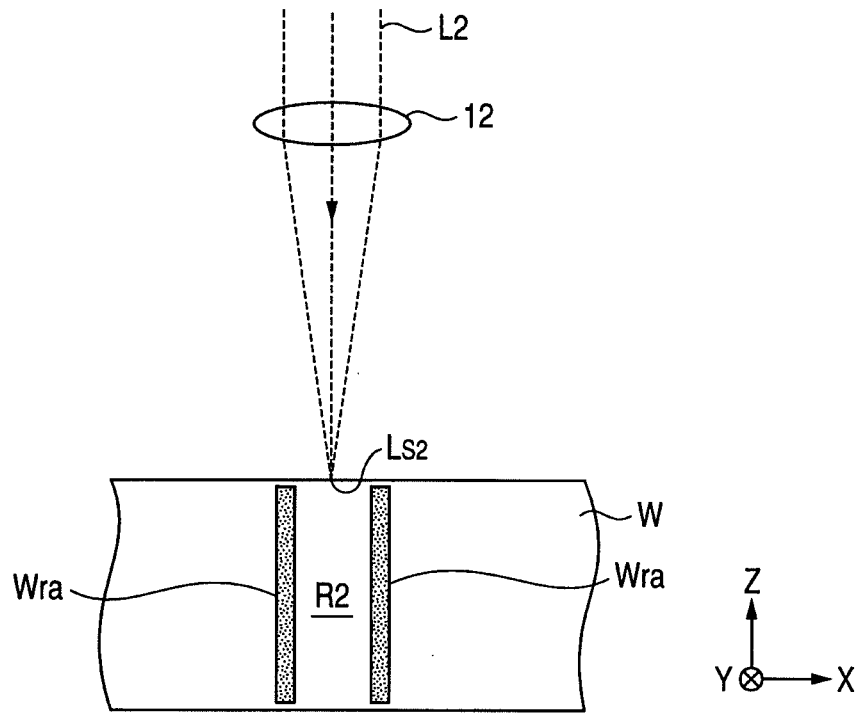

Next, the removing/processing step in the second embodiment is described in detail with reference to FIGS. 6A and 6B. The control device 4 performs control so as to irradiate the surface Wa of the substrate W with condensed processing laser light L2 to remove the laser processing region R2 defined by the modified layer Wra. Note that the conditions of the processing laser light L2 are the same as those in the first embodiment.

The condensing point $L_{S2}$ is a point in which an energy density of the processing laser light L2 is maximum in a case when the processing laser light L2 is condensed by the condensing lens 12. As illustrated in FIG. 6A, the surface Wa of the substrate W is scanned with the condensing point $L_{S2}$ to perform the removal processing in scanning positions of the condensing point $L_{S2}$. A scanning speed of the condensing point $L_{S2}$ is 100 mm/sec.

Figure 6B:
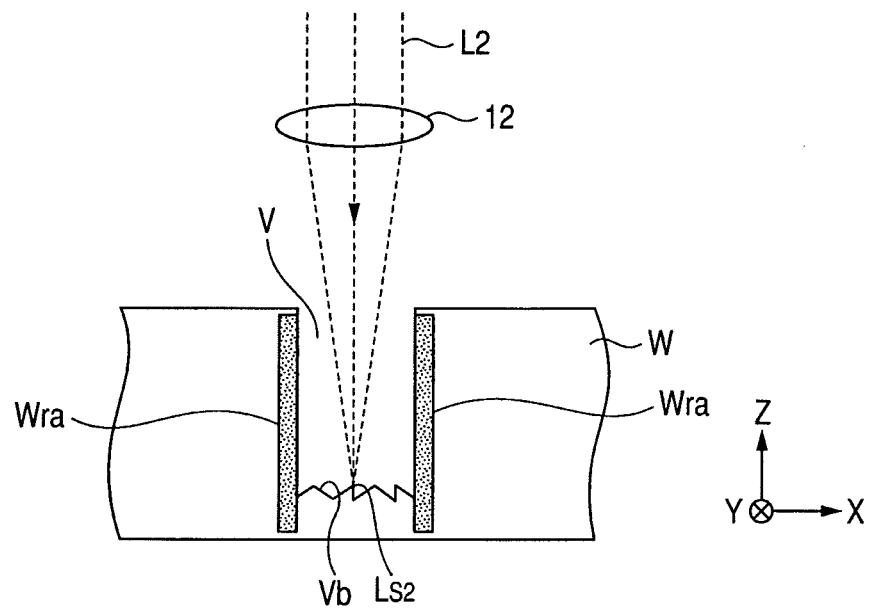

FIG. 6B illustrates a state during the removal processing. A bottom part Vb of a region V removed by the processing laser light L2 is illustrated in FIG. 6B. In the region V that is removed by the processing laser light L2, the amount of removal fluctuates depending on processing dust discharged by the removal processing or a fluctuation in intensity of the processing laser light L2, and, hence, a shape of the bottom part Vb fluctuates. In contrast to this, the laser processing speed of the modified layer Wra is lower than that in the non-modified region, and, hence, the modified layer Wra is not easily removed by the processing laser light L2 and the non-modified region is removed. Therefore, the processing shape may be defined by the modified layer Wra.

Figure 7A:
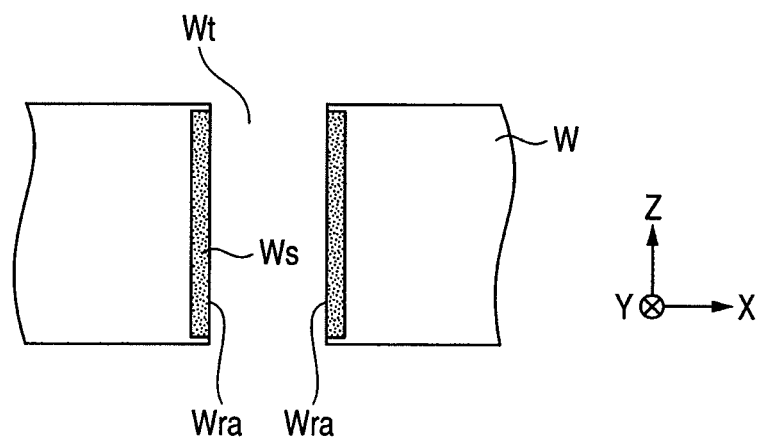
Figure 7B:
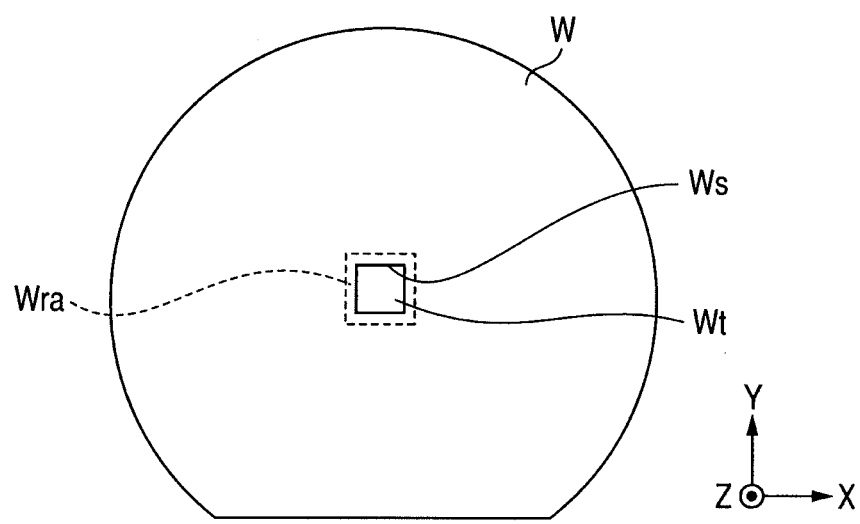

FIGS. 7A and 7B illustrate a through portion Wt formed by the laser processing method described above. As illustrated in FIGS. 7A and 7B, a side wall Ws of the through portion Wt corresponds to the modified layer Wra. When the modified layer Wra is formed, the precision of processing in the case when the substrate W is subjected to the removal processing with the processing laser light L2 is improved.

According to the second embodiment, the laser processing speed of the modified layer Wra during the removing/processing step is lower than that in the non-modified region, and, hence, the non-modified region is easily processed. Therefore, even when a spatial intensity distribution or pulse energy of the processing laser light L2 temporarily varies, a fluctuation in processing amount is reduced by the modified layer Wra, and, hence, the flatness of the side wall Ws of the through portion Wt may be improved. Thus, the precision of processing of the substrate W is improved. The modified layer Wra may be formed into an arbitrary shape by the modification laser light L1 during the modified layer forming step, and, hence, the degree of freedom of the processing shape is improved.

In the first embodiment, the modified layer is formed in only the bottom part of the recess portion. As in the second embodiment, however, the modified layer may be formed in the side wall of the recess portion. The modified layer may be freely formed according to the processing shape.

While the present invention has been described with reference to exemplary embodiments, it is to be understood that the invention is not limited to the disclosed exemplary embodiments. The scope of the following claims is to be accorded the broadest interpretation, so as to encompass all such modifications and equivalent structures and functions.

What is claimed is:

1. A laser processing method of processing an object to be processed, the object to be processed having a modified portion and a non-modified portion, the method comprising:
    a modified layer forming step of forming a modified layer of the object to be processed by scanning an inner portion of the object, with a condensing point of first laser light, the modified layer (i) having a processing speed with second laser light that is lower than a processing speed of a non-modified portion and (ii) being formed below the non-modified portion; and
    a removing step of removing a portion of the non-modified portion, the portion of the non-modified portion ranging from a surface of the object to the modified layer, the removing step comprising irradiating the portion of the non-modified portion with the second laser light.

2. The laser processing method according to claim 1, wherein the removing step further comprises forming a groove in the object by irradiating the portion of the non-modified portion with the second laser light, the modified layer being formed as a bottom part of the groove.

3. The laser processing method according to claim 1, wherein the removing step further comprises forming a hole as a through portion in the object by irradiating the portion of the non-modified portion with the second laser light, the modified layer being formed as a side wall of the through portion.

4. The laser processing method according to claim 1, wherein the modified layer comprises a melting processing region.

5. The laser processing method according to claim 1, wherein the modified layer comprises a crack region.

6. The laser processing method according to claim 1, wherein the modified layer comprises a refractive index change region.

7. The laser processing method according to claim 1, wherein an energy density of the first laser light at the condensing point is equal to or greater than $1 \times 10^8$ W/cm², and an energy density of the first laser light on the surface of the object is less than $1 \times 10^8$ W/cm².

8. The laser processing method according to claim 1, wherein the electrical field strength of the second laser light at the condensing point is equal to or greater than $1 \times 10^8$ W/cm².

9. A method of producing a substrate comprising:
    performing the laser processing method according to claim 1 in order to produce a substrate.

* * * * *